(12) United States Patent
Maxim et al.

(10) Patent No.: US 10,749,518 B2
(45) Date of Patent: Aug. 18, 2020

(54) STACKED FIELD-EFFECT TRANSISTOR SWITCH

(71) Applicant: Qorvo US, Inc., Greensboro, NC (US)

(72) Inventors: George Maxim, Saratoga, CA (US); Dirk Robert Walker Leipold, San Jose, CA (US); Julio C. Costa, Oak Ridge, NC (US); Marcus Granger-Jones, Scotts Valley, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 83 days.

(21) Appl. No.: 15/816,637

(22) Filed: Nov. 17, 2017

(65) Prior Publication Data

US 2018/0145678 A1 May 24, 2018

Related U.S. Application Data

(60) Provisional application No. 62/423,815, filed on Nov. 18, 2016.

(51) Int. Cl.
*H03B 1/00* (2006.01)
*H03K 3/00* (2006.01)
(Continued)

(52) U.S. Cl.
CPC ....... *H03K 17/161* (2013.01); *H01L 23/4824* (2013.01); *H01L 23/4825* (2013.01);
(Continued)

(58) Field of Classification Search
CPC .. H03K 17/161; H03K 17/102; H03K 17/162; H03K 17/063; H03K 17/122;
(Continued)

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 103811474 A 5/2014
CN 103872012 A 6/2014
(Continued)

OTHER PUBLICATIONS

Non-Final Office Action for U.S. Appl. No. 15/601,858, dated Apr. 17, 2019, 9 pages.
(Continued)

*Primary Examiner* — Metasebia T Retebo
(74) *Attorney, Agent, or Firm* — Withrow & Terranova, P.L.L.C.

(57) ABSTRACT

A stacked field-effect transistor (FET) switch is disclosed. The stacked FET switch has a first FET device stack that is operable in an on-state and in an off-state and is made up of a first plurality of FET devices coupled in series between a first port and a second port, wherein the first FET device stack has a conductance that decreases with increasing voltage between the first port and the second port. The stacked FET switch also includes a second FET device stack that is operable in the on-state and in the off-state and is made up of a second plurality of FET devices coupled in series between the first port and the second port, wherein the second FET device stack has a conductance that increases with increasing voltage between the first port and the second port.

21 Claims, 11 Drawing Sheets

(51) Int. Cl.
  *H03K 17/16* (2006.01)
  *H01L 23/482* (2006.01)
  *H01L 23/66* (2006.01)
  *H01L 29/10* (2006.01)
  *H01L 27/06* (2006.01)
  *H01L 49/02* (2006.01)
  *H01L 29/06* (2006.01)
  *H01L 27/12* (2006.01)
  *H03K 17/10* (2006.01)
  *H03K 17/06* (2006.01)
  *H03K 17/12* (2006.01)
  *H01L 27/092* (2006.01)
  *H01L 21/8238* (2006.01)

(52) U.S. Cl.
  CPC .......... *H01L 23/66* (2013.01); *H01L 27/0629* (2013.01); *H01L 27/1203* (2013.01); *H01L 28/60* (2013.01); *H01L 29/0692* (2013.01); *H01L 29/1054* (2013.01); *H03K 17/063* (2013.01); *H03K 17/102* (2013.01); *H03K 17/122* (2013.01); *H03K 17/162* (2013.01); *H01L 21/823807* (2013.01); *H01L 27/092* (2013.01)

(58) Field of Classification Search
  CPC . H01L 23/4824; H01L 23/4825; H01L 23/66; H01L 29/1054; H01L 27/0629; H01L 28/60; H01L 29/0692; H01L 27/1203; H01L 21/823807; H01L 27/092
  USPC ........................................................ 327/109
  See application file for complete search history.

(56) References Cited

U.S. PATENT DOCUMENTS

| | | | |
|---|---|---|---|
| 5,013,681 A | 5/1991 | Godbey et al. | |
| 5,061,663 A | 10/1991 | Bolt et al. | |
| 5,069,626 A | 12/1991 | Patterson et al. | |
| 5,362,972 A * | 11/1994 | Yazawa | B82Y 10/00 257/13 |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,729,075 A | 3/1998 | Strain | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,377,112 B1 * | 4/2002 | Rozsypal | H01L 27/0921 327/534 |
| 6,423,570 B1 | 7/2002 | Ma et al. | |
| 6,426,559 B1 | 7/2002 | Bryan et al. | |
| 6,441,498 B1 | 8/2002 | Song | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,238,560 B2 | 7/2007 | Sheppard et al. | |
| 7,279,750 B2 | 10/2007 | Jobetto | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,402,901 B2 | 7/2008 | Hatano et al. | |
| 7,427,824 B2 | 9/2008 | Iwamoto et al. | |
| 7,489,032 B2 | 2/2009 | Jobetto | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,843,072 B1 | 11/2010 | Park et al. | |
| 7,855,101 B2 | 12/2010 | Furman et al. | |
| 7,868,419 B1 | 1/2011 | Kerr et al. | |
| 7,910,405 B2 | 3/2011 | Okada et al. | |
| 7,960,218 B2 | 6/2011 | Ma et al. | |
| 8,004,089 B2 | 8/2011 | Jobetto | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,658,475 B1 | 2/2014 | Kerr | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,803,242 B2 * | 8/2014 | Marino | H01L 21/823431 257/369 |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 8,983,399 B2 | 3/2015 | Kawamura et al. | |
| 9,165,793 B1 | 10/2015 | Wang et al. | |
| 9,214,337 B2 | 12/2015 | Carroll et al. | |
| 9,349,700 B2 | 5/2016 | Hsieh et al. | |
| 9,368,429 B2 | 6/2016 | Ma et al. | |
| 9,461,001 B1 | 10/2016 | Tsai et al. | |
| 9,520,428 B2 | 12/2016 | Fujimori | |
| 9,530,709 B2 | 12/2016 | Leipold et al. | |
| 9,613,831 B2 | 4/2017 | Morris et al. | |
| 9,646,856 B2 | 5/2017 | Meyer et al. | |
| 9,653,428 B1 | 5/2017 | Hiner et al. | |
| 9,786,586 B1 | 10/2017 | Shih | |
| 9,812,350 B2 | 11/2017 | Costa | |
| 9,824,951 B2 | 11/2017 | Leipold et al. | |
| 9,824,974 B2 | 11/2017 | Gao et al. | |
| 9,859,254 B1 | 1/2018 | Yu et al. | |
| 9,875,971 B2 | 1/2018 | Bhushan et al. | |
| 9,941,245 B2 | 4/2018 | Skeete et al. | |
| 10,134,837 B1 | 11/2018 | Fanelli et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2003/0207515 A1 | 11/2003 | Tan et al. | |
| 2004/0021152 A1 | 2/2004 | Nguyen et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0077511 A1 | 4/2005 | Fitzgerald | |
| 2005/0079686 A1 | 4/2005 | Aigner et al. | |
| 2005/0212419 A1 | 9/2005 | Vazan et al. | |
| 2006/0057782 A1 | 3/2006 | Gardes et al. | |
| 2006/0099781 A1 | 5/2006 | Beaumont et al. | |

(56) References Cited

U.S. PATENT DOCUMENTS

| | | |
|---|---|---|
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1* | 10/2008 | Englekirk ............ H03K 17/102 327/427 |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1* | 12/2014 | Oh .................. B32B 27/08 428/216 |
| 2015/0015321 A1* | 1/2015 | Dribinsky ............ H03K 17/102 327/394 |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1* | 1/2017 | Connelly ............ G06F 17/5036 |
| 2017/0032957 A1 | 2/2017 | Costa et al. |
| 2017/0033026 A1 | 2/2017 | Ho et al. |
| 2017/0053938 A1* | 2/2017 | Whitefield .......... H01L 27/1203 |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0269188 A1 | 9/2018 | Yu et al. |
| 2019/0172842 A1* | 6/2019 | Whitefield .......... H01L 27/1203 |
| 2019/0189599 A1 | 6/2019 | Baloglu et al. |
| 2019/0287953 A1 | 9/2019 | Moon et al. |
| 2019/0304910 A1 | 10/2019 | Fillion |
| 2020/0058541 A1 | 2/2020 | Konishi et al. |

FOREIGN PATENT DOCUMENTS

| | | |
|---|---|---|
| EP | 2996143 A1 | 3/2016 |
| JP | S505733 Y1 | 2/1975 |
| JP | H11-220077 A | 8/1999 |
| JP | 200293957 A | 3/2002 |
| JP | 2002252376 A | 9/2002 |
| JP | 2006005025 A | 1/2006 |
| JP | 2007227439 A | 9/2007 |

(56) References Cited

FOREIGN PATENT DOCUMENTS

| | | |
|---|---|---|
| JP | 2008235490 A | 10/2008 |
| JP | 2008279567 A | 11/2008 |
| JP | 2009026880 A | 2/2009 |
| JP | 2009530823 A | 8/2009 |
| JP | 2011243596 A | 12/2011 |
| WO | 2007074651 A1 | 7/2007 |
| WO | 2018083961 A1 | 5/2018 |
| WO | 2018125242 A1 | 7/2018 |

OTHER PUBLICATIONS

Notice of Allowance for U.S. Appl. No. 16/004,961, dated May 13, 2019, 8 pages.

Final Office Action for U.S. Appl. No. 15/992,613, dated May 24, 2019, 11 pages.

Notice of Allowance for U.S. Appl. No. 15/992,639, dated May 9, 2019, 7 pages.

Non-Final Office Action for U.S. Appl. No. 15/873,152, dated May 24, 2019, 11 pages.

Notice of Allowance for U.S. Appl. No. 16/168,327, dated Jun. 28, 2019, 7 pages.

Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.

Shukla, Shishir, et al., "GaN—On—Si Switched Mode RF Power Amplifiers for Non-Constant Envelope Signals," IEEE Topical Conference on RF/Microwave Power Amplifiers for Radio and Wireless Applications, 2017, pp. 88-91.

Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.

Tsai, Chun-Lin, et al., "Smart GaN platform; Performance & Challenges," IEEE International Electron Devices Meeting, 2017, 4 pages.

International Search Report and Written Opinion for International Patent Application No. PCT/US19/25591, dated Jun. 21, 2019, 7 pages.

Notice of Reasons for Refusal for Japanese Patent Application No. 2015-180657, dated Jul. 9, 2019, 4 pages.

Notice of Allowance for U.S. Appl. No. 15/601,858, dated Aug. 16, 2019, 8 pages.

Notice of Allowance for U.S. Appl. No. 16/004,961, dated Aug. 28, 2019, 8 pages.

Advisory Action for U.S. Appl. No. 15/992,613, dated Jul. 29, 2019, 3 pages.

Final Office Action for U.S. Appl. No. 15/873,152, dated Aug. 8, 2019, 13 pages.

Notice of Allowance for U.S. Appl. No. 15/975,230, dated Jul. 22, 2019, 7 pages.

First Office Action for Chinese Patent Application No. 201510746323.X, dated Nov. 2, 2018, 12 pages.

Notice of Allowance for U.S. Appl. No. 16/038,879, ated Jan. 9, 2019, 8 pages.

Non-Final Office Action for U.S. Appl. No. 15/945,418, dated Nov. 1, 2018, 13 pages.

Final Office Action for U.S. Appl. No. 15/601,858, dated Nov. 26, 2018, 16 pages.

Advisory Action for U.S. Appl. No. 15/601,858, dated Jan. 22, 2019, 3 pages.

Notice of Allowance for U.S. Appl. No. 16/004,961, dated Jan. 11, 2019, 8 pages.

Final Office Action for U.S. Appl. No. 15/616,109, dated Apr. 19, 2018, 18 pages.

Notice of Allowance for U.S. Appl. No. 15/795,915, dated Jun. 15, 2018, 7 pages.

Non-Final Office Action for U.S. Appl. No. 15/262,457, dated Apr. 19, 2018, 10 pages.

Notice of Allowance for U.S. Appl. No. 15/491,064, dated Apr. 30, 2018, 9 pages.

Non-Final Office Action for U.S. Appl. No. 15/601,858, dated Jun. 26, 2018, 12 pages.

Notice of Allowance for U.S. Appl. No. 15/616,109, dated Jul. 2, 2018, 7 pages.

Notice of Allowance for U.S. Appl. No. 15/676,621, dated Jun. 5, 2018, 8 pages.

Non-Final Office Action for U.S. Appl. No. 15/676,693, dated May 3, 2018, 14 pages.

Notice of Allowance for U.S. Appl. No. 15/789,107, dated May 18, 2018, 8 pages.

Notice of Allowance for U.S. Appl. No. 15/695,629, dated Jul. 11, 2018, 12 pages.

Final Office Action for U.S. Appl. No. 15/387,855, dated May 24, 2018, 9 pages.

Raskin, Jean-Pierre et al., "Substrate Crosstalk Reduction Using SOI Technology," IEEE Transactions on Electron Devices, vol. 44, No. 12, Dec. 1997, pp. 2252-2261.

Rong, B., et al., "Surface-Passivated High-Resistivity Silicon Substrates for RFICs," IEEE Electron Device Letters, vol. 25, No. 4, Apr. 2004, pp. 176-178.

Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.

Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.

Non-Final Office Action for U.S. Appl. No. 13/852,648, dated Jul. 18, 2013, 20 pages.

Final Office Action for U.S. Appl. No. 13/852,648, dated Nov. 26, 2013, 21 pages.

Applicant-Initiated Interview Summary for U.S. Appl. No. 13/852,648, dated Jan. 27, 2014, 4 pages.

Advisory Action for U.S. Appl. No. 13/852,648, dated Mar. 7, 2014, 4 pages.

Notice of Allowance for U.S. Appl. No. 13/852,648, dated Jun. 16, 2014, 9 pages.

Notice of Allowance for U.S. Appl. No. 13/852,648, dated Sep. 26, 2014, 8 pages.

Notice of Allowance for U.S. Appl. No. 13/852,648, dated Jan. 22, 2015, 8 pages.

Non-Final Office Action for U.S. Appl. No. 13/852,648, dated Jun. 24, 2015, 20 pages.

Final Office Action for U.S. Appl. No. 13/852,648, dated Oct. 22, 2015, 20 pages.

Non-Final Office Action for U.S. Appl. No. 13/852,648, dated Feb. 19, 2016, 12 pages.

Final Office Action for U.S. Appl. No. 13/852,648, dated Jul. 20, 2016, 14 pages.

Non-Final Office Action for U.S. Appl. No. 14/315,765, dated Jan. 2, 2015, 6 pages.

Final Office Action for U.S. Appl. No. 14/315,765, dated May 11, 2015, 17 pages.

Advisory Action for U.S. Appl. No. 14/315,765, dated Jul. 22, 2015, 3 pages.

Non-Final Office Action for U.S. Appl. No. 14/260,909, dated Mar. 20, 2015, 20 pages.

Final Office Action for U.S. Appl. No. 14/260,909, dated Aug. 12, 2015, 18 pages.

Non-Final Office Action for U.S. Appl. No. 14/261,029, dated Dec. 5, 2014, 15 pages.

Notice of Allowance for U.S. Appl. No. 14/261,029, dated Apr. 27, 2015, 10 pages.

Corrected Notice of Allowability for U.S. Appl. No. 14/261,029, dated Nov. 17, 2015, 5 pages.

(56) References Cited

OTHER PUBLICATIONS

Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Notice of Allowance for U.S. Appl. No. 15/387,855, dated Aug. 10, 2018, 7 pages.
Notice of Allowance and Applicant-Initiated Interview Summary for U.S. Appl. No. 15/262,457, dated Sep. 28, 2018, 16 pages.
Notice of Allowance for U.S. Appl. No. 15/676,693, dated Jul. 20, 2018, 8 pages.
Corrected Notice of Allowance for U.S. Appl. No. 15/676,693, dated Aug. 29, 2018, 5 pages.
Notice of Allowance for U.S. Appl. No. 15/914,538, dated Aug. 1, 2018, 9 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.

(56) References Cited

OTHER PUBLICATIONS

Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Advisory Action and Applicant-Initiated Interview Summary for U.S. Appl. No. 15/262,457, dated Feb. 28, 2015, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx? matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal_pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss Cpw Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.

(56) References Cited

OTHER PUBLICATIONS

Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Yep., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 15/695,579, dated Jan. 28, 2019, 8 pages.
Notice of Allowance for U.S. Appl. No. 15/695,579, dated Mar. 20, 2019, 8 pages.
Non-Final Office Action for U.S. Appl. No. 15/992,613, dated Feb. 27, 2019, 15 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
U.S. Appl. No. 14/261,029, filed Apr. 24, 2014; now U.S. Pat. No. 9,214,337.
U.S. Appl. No. 14/529,870, filed Oct. 31, 2014; now U.S. Pat. No. 9,583,414.
U.S. Appl. No. 15/293,947, filed Oct. 14, 2016.
U.S. Appl. No. 14/715,830, filed May 19, 2015; now U.S. Pat. No. 9,812,350.
U.S. Appl. No. 15/616,109, filed Jun. 7, 2017.
U.S. Appl. No. 14/851,652, filed Sep. 11, 2015; now U.S. Pat. No. 9,824,951.
U.S. Appl. No. 14/872,910, filed Oct. 1, 2015.
U.S. Appl. No. 14/885,202, filed Oct. 16, 2015.
U.S. Appl. No. 14/885,243, filed Oct. 16, 2915; now U.S. Pat. No. 9,530,709.
U.S. Appl. No. 15/387,855, filed Dec. 22, 2016.
U.S. Appl. No. 14/959,129, filed Dec. 4, 2015, now U.S. Pat. No. 9,613,831.
U.S. Appl. No. 15/173,037, filed Jun. 3, 2016.
U.S. Appl. No. 15/648,082, filed Jul. 12, 2017.
U.S. Appl. No. 15/229,780, filed Aug. 5, 2016.
U.S. Appl. No. 15/262,457, filed Sep. 12, 2016.
U.S. Appl. No. 15/408,560, filed Jan. 18, 2017.
U.S. Appl. No. 15/287,202, filed Oct. 6, 2016.
U.S. Appl. No. 15/601,858, filed May 22, 2017.
U.S. Appl. No. 15/353,346, filed Nov. 16, 2016.
U.S. Appl. No. 15/652,826, filed Jul. 18, 2017.
U.S. Appl. No. 15/287,273, filed Oct. 6, 2016.
U.S. Appl. No. 15/676,415, filed Aug. 14, 2017.
U.S. Appl. No. 15/676,621, filed Aug. 14, 2017.
U.S. Appl. No. 15/676,693, filed Aug. 14, 2017.
U.S. Appl. No. 15/498,040, filed Apr. 26, 2017.
U.S. Appl. No. 15/652,867, filed Jul. 18, 2017.
U.S. Appl. No. 15/789,107, filed Oct. 20, 2017.
U.S. Appl. No. 15/491,064, filed Apr. 19, 2017.
U.S. Appl. No. 15/695,579, filed Sep. 5, 2017.
U.S. Appl. No. 15/695,629, filed Sep. 5, 2017.
Notice of Allowance for U.S. Appl. No. 15/992,613, dated Sep. 23, 2019, 7 page.
Non-Final Office Action for U.S. Appl. No. 16/204,214, dated Oct. 9, 2019, 15 pages.
Advisory Action for U.S. Appl. No. 15/873,152, dated Oct. 11, 2019, 3 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Office Action for Japanese Patent Application No. 2018-526613, dated Nov. 5, 2019, 8 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Decision of Rejection for Japanese Patent Application No. 2015-180657, dated Mar. 17, 2020, 4 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Notice of Allowance for U.S. Appl. No. 16/038,879, dated Apr. 15, 2020, 9 pages.
Corrected Notice of Allowability for U.S. Appl. No. 15/695,579, dated Feb. 5, 2020, 5 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Final Office Action for U.S. Appl. No. 16/204,214, dated Mar. 6, 2020, 14 pages.

(56) References Cited

OTHER PUBLICATIONS

Advisory Action for U.S. Appl. No. 16/204,214, dated Apr. 15, 2020, 3 pages.
Nelser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Quayle Action for U.S. Appl. No. 16/703,251, dated Jun. 26, 2020, 5 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.
Notice of Allowance for U.S. Appl. No. 16/004,961, dated Apr. 30, 2020, 8 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/204,214, dated May 19, 2020, 15 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.

\* cited by examiner

STACKED FIELD-EFFECT TRANSISTOR SWITCH

RELATED APPLICATIONS

This application claims the benefit of provisional patent application Ser. No. 62/423,815, filed Nov. 18, 2016, the disclosure of which is hereby incorporated herein by reference in its entirety.

FIELD OF THE DISCLOSURE

The present disclosure relates to reducing noise generated by a radio frequency (RF) switch that is in an on-state while passing an applied RF signal through the RF switch.

BACKGROUND

An important electronic component of a radio frequency (RF) transceiver is a field-effect transistor (FET) that makes up stacked FET-type RF switches. An RF switch that is FET based typically needs linearity compensation to prevent generation of harmonic distortion when transmit signals are applied to the RF switch while the RF switch is in an on-state. The RF switch is effectively closed while in the on-state, and the transmit signals pass through the RF switch. However, while the RF switch is closed, undesirable harmonics are generated from the transmit signals in part due to non-linear conductance inherent to the RF switch. The undesirable harmonics pass from the RF switch and interfere with the RF transceiver's receiver circuitry. What is needed is an RF switch that limits undesirable harmonics due to non-linear conductance.

SUMMARY

A stacked field-effect transistor (FET) switch is disclosed. The stacked FET switch has a first FET device stack that is operable in an on-state and in an off-state and is made up of a first plurality of FET devices coupled in series between a first port and a second port, wherein the first FET device stack has a conductance that decreases with increasing voltage between the first port and the second port between 10% and 99% of a first breakdown voltage of the first FET device stack. The stacked FET switch also includes a second FET device stack that is operable in the on-state and in the off-state and is made up of a second plurality of FET devices coupled in series between the first port and the second port, wherein the second FET device stack has a conductance that increases with increasing voltage between the first port and the second port between 10% and 99% of a second breakdown voltage of the second FET device stack.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
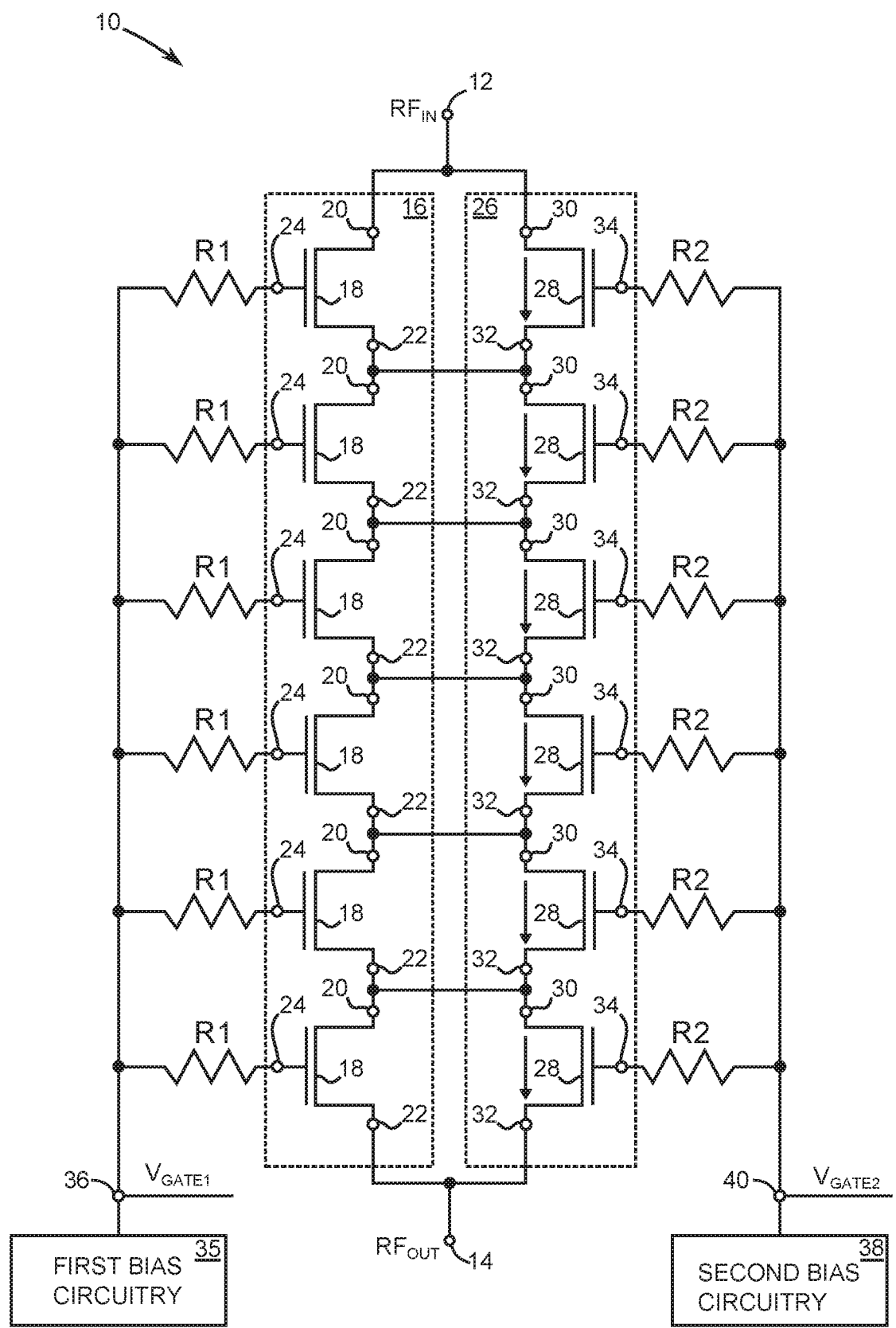
FIG. 1 is a schematic of a stacked field-effect transistor (FET) switch that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

For the purpose of this disclosure, a ballistic field-effect transistor (FET) is a semiconductor device having a gate, a source, a drain, and a channel between the source and the drain in which the length L of the channel is less than a mean-free-path $\lambda$ that is the average distance between electron scattering events within the channel. Due to the relatively short channel length L compared with the mean-free-path $\lambda$, the ballistic FET has a characteristic of electron propagation between the source and the drain with practically no electron scattering due to collisions with phonons and/or channel defects while in a current-conducting state controlled by a control voltage applied to the gate. Further still, in accordance with the present disclosure, a ballistic FET has conductance within the channel that increases with increasing voltage between the source and the drain between 10% and 99% of a breakdown voltage of the ballistic FET. Moreover, a ballistic FET is a device in which at least 70% of carriers are transported ballistically. Further still, ballistic transport occurs when carriers have enough speed to generate a transition from the indirect band to the direct band. A new schematic symbol is used to identify ballistic FETs in the Figures of the present disclosure. The new symbol has an arrow pointing between the source and drain of a traditional FET symbol. The arrow denotes the ballistic carrier transport between the source and drain of the ballistic FET.

Also for the purpose of this disclosure, a drift FET is a traditional semiconductor device having a gate, a source, a drain, and a channel between the source and the drain in which the length L of the channel is greater than the mean-free-path $\lambda$ that is the average distance between electron scattering events within the channel. Moreover, a drift FET is a device in which at least 50% of carriers are transported by drift.

FIG. 1 is a schematic of a stacked FET switch 10 that is structured in accordance with the present disclosure. The stacked FET switch 10 has a first port 12 and a second port 14. When in a closed state, the stacked FET switch 10 allows passing of radio frequency (RF) signals between the first port 12 and the second port 14. When in an open state, the stacked FET switch 10 prevents RF signals from passing between the first port 12 and the second port 14. In the exemplary embodiment of FIG. 1, the first port 12 is an RF input $RF_{IN}$ and the second port 14 is an RF output $RF_{OUT}$. However, it is to be understood that either of the first port 12 or second port 14 may be considered an RF input or an RF output depending on which direction an RF signal is passing through the stacked FET switch 10.

The stacked FET switch 10 has a first FET device stack 16 that is operable in an on-state when the stacked FET switch 10 is in the closed state and in an off-state when the stacked FET switch 10 is in the open state. The first device FET stack 16 is made up of a first plurality of FET devices 18 coupled in series between the first port 12 and the second port 14. Each of the first plurality of FET devices 18 has a first current terminal 20, a second current terminal 22, and a control terminal 24. The first current terminal 20 and the second current terminal 22 are typically a drain terminal and a source terminal, respectively, and the control terminal 24 is typically a gate terminal. In the exemplary embodiment of FIG. 1, the drain terminal and the source terminal are interchangeable; hence the first current terminal 20 and the second current terminal 22 are not specifically designated as source and drain.

The first FET device stack 16 has an on-state conductance $G_{ON}$ that decreases with increasing voltage between the first port 12 and the second port 14 between 10% and 99% of a first breakdown voltage of the first FET device stack 16. In other words, an on-state resistance typically referred to as $R_{ON}$ increases for each of the first plurality of FET devices 18 with increasing voltage between the first port 12 and the second port 14.

At some point between 10% and 99% of the first breakdown voltage of the first FET device stack 16, the on-state conductance $G_{ON}$ decreases non-linearly, which results in non-linear harmonic distortion. To limit the non-linear harmonic distortion, the stacked FET switch 10 includes a second FET device stack 26 that is operable in the on-state and in the off-state, the second FET device stack comprising a second plurality of FET devices 28 coupled in series between the first port and the second port and having a conductance that increases with increasing voltage between the first port and the second port between 10% and 99% of a second breakdown voltage of the second FET device stack 26.

The second FET device stack 26 is made up of a second plurality of FET devices 28 coupled in series between the first port 12 and the second port 14. Each of the second plurality of FET devices 28 has a third current terminal 30, a fourth current terminal 32, and a second control terminal 34. The third current terminal 30 and the fourth current terminal 32 are typically a drain terminal and a source terminal, respectively, and the second control terminal 34 is typically a gate terminal. Similar to the plurality of FET devices 18, the drain terminal and the source terminal are interchangeable; hence the third current terminal 30 and the fourth current terminal 32 are not specifically designated as source and drain in this exemplary embodiment. Also, in this exemplary embodiment, each of the first plurality of FET devices 18 is coupled in parallel with a corresponding one of the second plurality of FET devices 28. Specifically, first current terminal 20 and third current terminal 30 of opposing ones of the first plurality of FET devices 18 and the second plurality of FET devices 28 are coupled together. Moreover, the second current terminal 22 and the fourth current terminal 32 of opposing ones of the first plurality of FET devices 18 and the second plurality of FET devices 28 are coupled together.

The second FET device stack 26 has a compensating on-state conductance $G_{ON\_COMP}$ that increases with increasing voltage between the first port 12 and the second port 14 between 10% and 99% of the second breakdown voltage of the second FET device stack 26. In other words, the on-state resistance typically referred to as $R_{ON}$ decreases for each of the second plurality of FET devices 28 with increasing voltage between the first port 12 and the second port 14. The compensating on-state conductance $G_{ON\_COMP}$ of the second FET device stack 26 counteracts the on-state conductance $G_{ON}$ of the first FET device stack 16, which in turn limits generation of harmonic distortion with the stacked FET switch 10.

The compensating on-state conductance $G_{ON\_COMP}$ of the second FET device stack 26 is effective at limiting generation of harmonic distortion over design corners of process, supply voltage, and temperature. A maximum limitation of harmonic distortion may be achieved by providing appropriate values of direct current (DC) bias voltages to the gates of the first plurality of FET devices 18 and/or the second plurality of FET devices 28.

In this regard, a first bias circuitry 35 provides a DC bias voltage to the control terminals 24 of the first plurality of FET devices 18 through resistors R1 coupled between a first bias output terminal 36 and individual ones of the control terminals 24. There is one each of the resistors R1 for each of the control terminals 24. The resistors R1 typically have mega-ohm resistance values. A first gate control voltage $V_{GATE1}$ for turning the first plurality of FET devices 18 from the off-state to the on-state may be applied to the first bias output terminal 36. Also included is a second bias circuitry 38 that provides a DC bias voltage to the second control terminals 34 of the second plurality of FET devices 28 through resistors R2 coupled between a second bias output terminal 40 and individual ones of the second control terminals 34. There is one each of the resistors R2 for each of the control terminals 24. The resistors R2 typically have mega-ohm resistance values. A second gate control voltage $V_{GATE2}$ for turning the second plurality of FET devices 28 from the off-state to the on-state may be applied to the second bias output terminal 40. In some embodiments, the first bias circuitry 35 and/or the second bias circuitry 38 are configured to automatically adjust bias voltage level to track with changes in process, supply voltage, and temperature. In some embodiments, the first bias circuitry 35 is configured to generate a first bias voltage level that is different from a second bias voltage level generated by the second bias circuitry 38 in order to appropriately bias the first plurality of FET devices 18 and the second plurality of FET devices 28, which have different electrical characteristics that require different bias voltage levels for proper operation.

Maximum limiting of harmonic distortion may also be achieved by changing the device sizes of the second plurality of FET devices 28 relative to the device sizes of first plurality of FET devices 18. Effective device size may be adjusted by controlling how many transistor fingers of the second plurality of FET devices 28 are active. Alternatively, fixed device sizes for the second plurality of FET devices 28 relative to the device sizes of first plurality of FET devices 18 may be selected to maximize the limitation of harmonic distortion over an expected range of process, supply voltage, and temperature changes.

To achieve opposing on-state conductance $G_{ON}$ and compensating on-state conductance $G_{ON\_COMP}$, FET devices having opposing conductance characteristics are selected for the first plurality of FET devices 18 and the second plurality of FET devices 28, respectively. For the exemplary embodiments of the present disclosure, traditional drift FETs are selected for the first plurality of FET devices 18, and ballistic FET devices are selected for the second plurality of FET devices 28. At least 50% carrier transport of the first plurality of FET devices is drift transport, and at least 70% of carrier transport of the second plurality of FET devices is ballistic transport. As a result, ballistic FET devices have increasing conductance as voltage increases from source to drain between 10% and 99% of the breakdown voltage for individual ballistic FET devices. Exemplary channel lengths L for N-channel ballistic FET devices are between 22 nm and 3 nm, whereas N-channel drift FET devices have channel lengths L that are greater than 22 nm. In general P-channel FET devices are the first FET devices to exhibit ballistic transport of carriers with decreasing gate length. P-channel FET devices typically begin to exhibit quasi-ballistic transport at 45 nm due to crystal strain that influences hole mobility greater than electron mobility. It is to be understood that while the present disclosure employs ballistic FET devices in exemplary embodiments, it is envisioned that other types of FET devices having increasing conductance as voltage increases across source and drain between 10% and 99% of the breakdown voltage for individual FET devices may also be employable to compensate for the opposing conductance characteristic of traditional drift FET devices.

Figure 2:
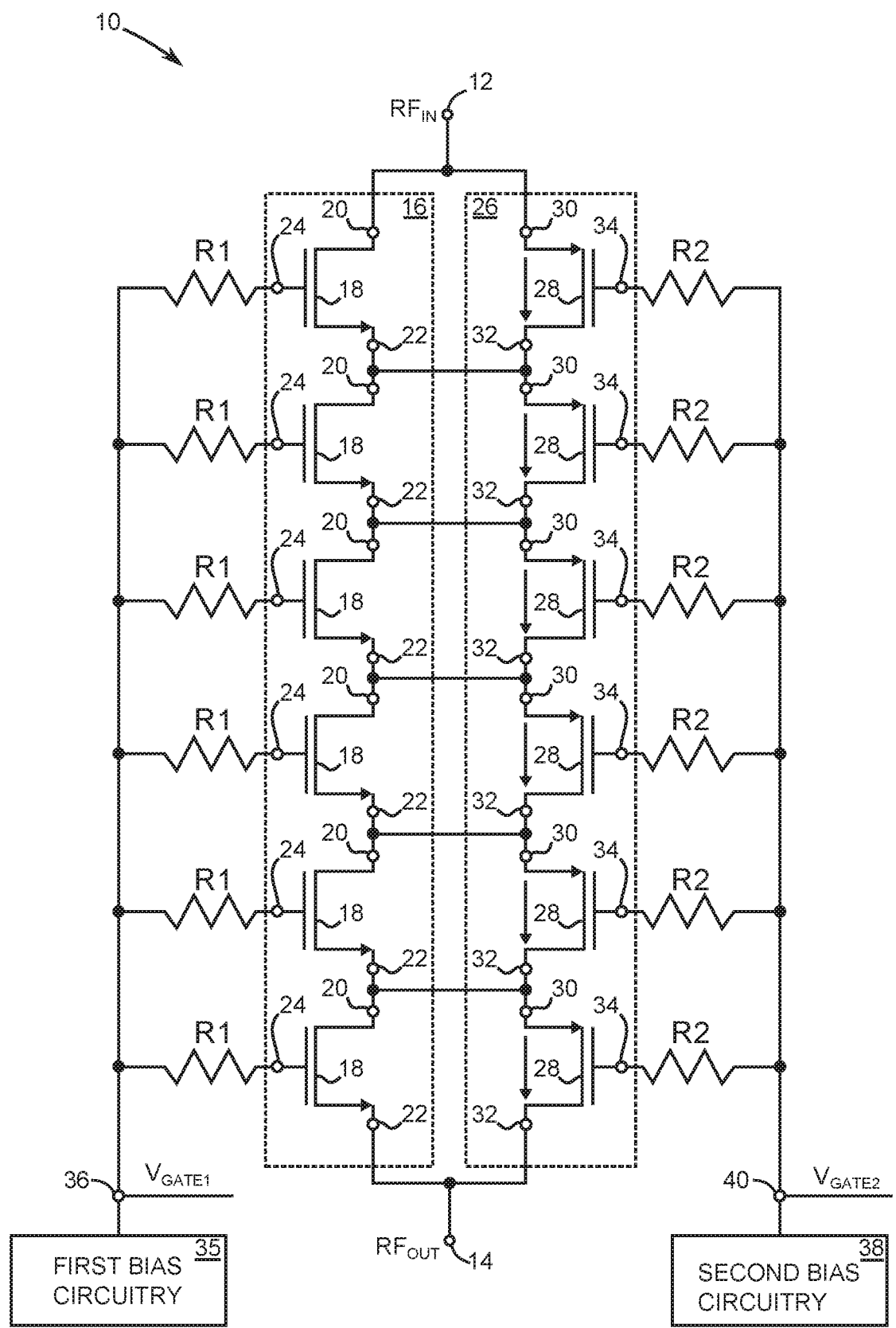
FIG. 2 is a schematic of an embodiment of the stacked FET switch of FIG. 1 that employs N-channel FET devices for a first plurality of FET devices and P-channel FET devices for a second plurality of FET devices that are coupled in parallel with the first plurality of FET devices.

FIG. 2 is a schematic of an embodiment of the stacked FET switch 10 of FIG. 1 that employs N-channel FET devices for the first plurality of FET devices 18 and P-channel FET devices for the second plurality of FET devices 28. P-channel FET devices typically begin to exhibit quasi-ballistic transport at 45 nm due to crystal strain that influences hole mobility greater than electron mobility. In at least one embodiment, the P-channel FET devices are germanium doped to enhance carrier mobility in comparison to P-channel silicon metal oxide semiconductor FETs. In some embodiments, the P-channel FET devices have a germanium-strained silicon structure. It is to be understood that drift-mode P-channel FET devices may be used for the first plurality of FET devices 18 while ballistic-mode N-channel FET devices are used for the second plurality of FET devices 28.

Figure 3:
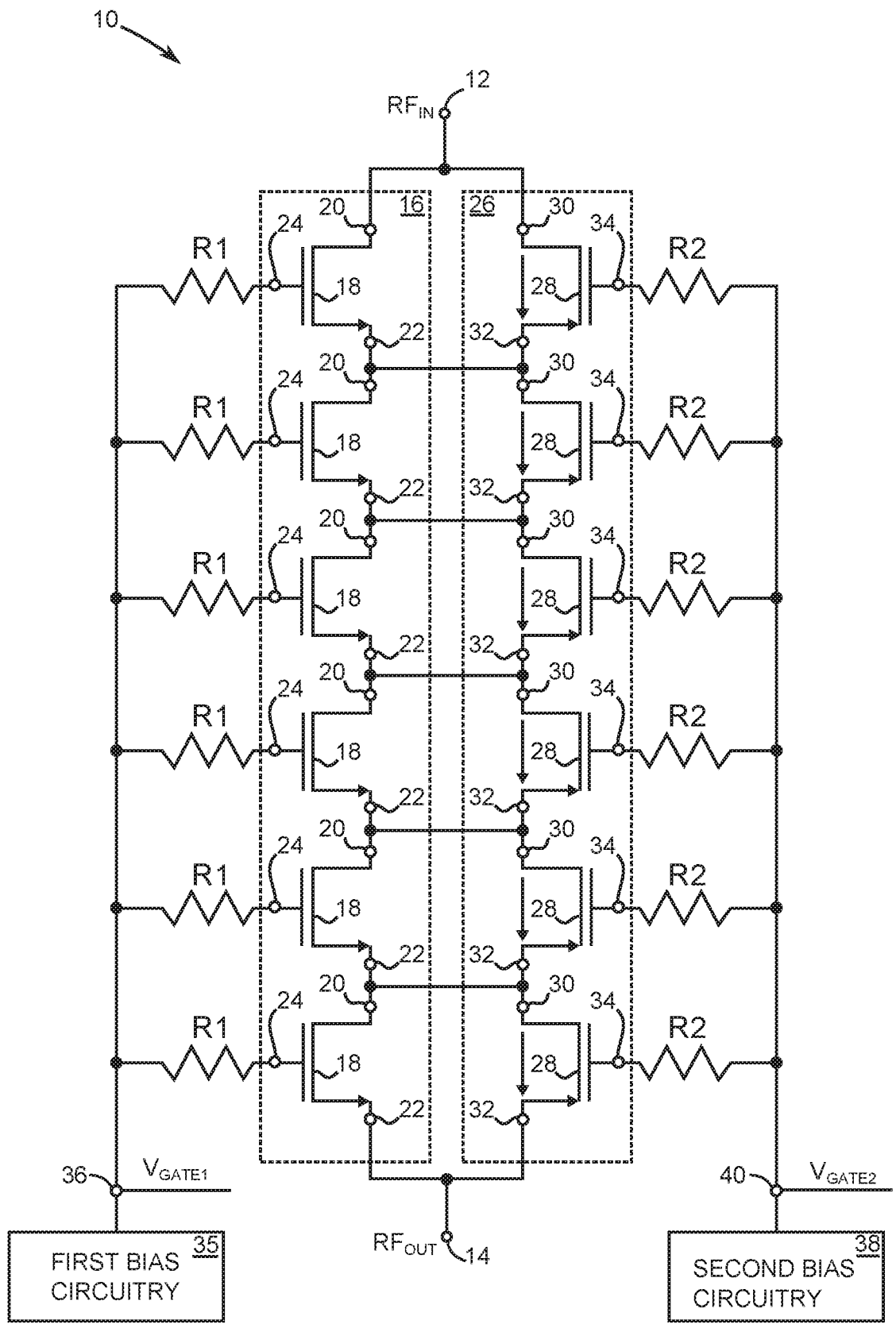
FIG. 3 is a schematic of an embodiment of the stacked FET switch of FIG. 1 that employs N-channel FET devices for both the first plurality of FET devices and the second plurality of FET devices that are coupled in parallel with the first plurality of FET devices.

FIG. 3 is a schematic of an embodiment of the stacked FET switch 10 of FIG. 1 that employs N-channel FET devices for both the first plurality of FET devices 18 and the second plurality of FET devices 28. However, the N-channel FET devices making up the first plurality of FET devices 18 have channel lengths that are long enough to operate in the drift mode, whereas the N-channel FET devices making up the second plurality of FET devices 28 have channel lengths short enough to operate in the ballistic mode.

Figure 4:
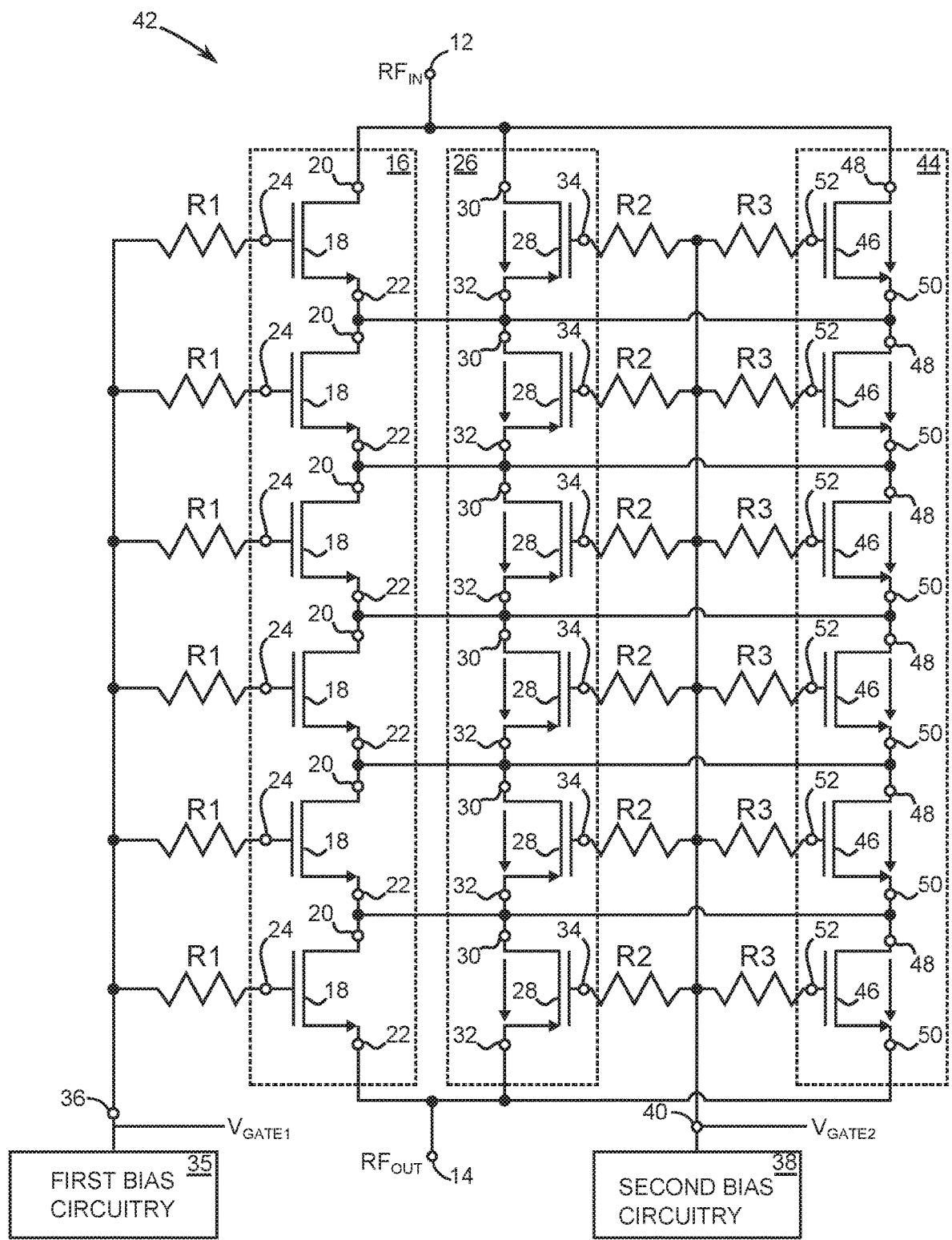
FIG. 4 is a schematic of another embodiment of a stacked FET switch that in accordance with the present disclosure includes at least a third FET device stack added to a structure in common with the stacked FET switch of FIGS. 1-3.

FIG. 4 is a schematic of an embodiment of a stacked FET switch 42 that in accordance with the present disclosure includes at least a third FET device stack 44 added to a structure in common with the stacked FET switch 10 of FIGS. 1-3. The third FET device stack 44 is made up of a third plurality of FET devices 46 coupled in series between the first port 12 and the second port 14. Each of the third plurality of FET devices 46 has a fifth current terminal 48, a sixth current terminal 50, and a third control terminal 52. The fifth current terminal 48 and the sixth current terminal 50 are typically a drain terminal and a source terminal, respectively, and the third control terminal 52 is typically a gate terminal. Also, in this exemplary embodiment of FIG. 4, each of the first plurality of FET devices 18 is coupled in parallel with a corresponding one of the second plurality of FET devices 28 and a corresponding one of the third plurality of FET devices 46. Specifically, first current terminal 20, the third current terminal 30, and the fifth current terminal 48 of opposing ones of the first plurality of FET devices 18, the second plurality of FET devices 28, and the third plurality of FET devices 46, respectively, are coupled together. Moreover, the second current terminal 22, the fourth current terminal 32, and the sixth current terminal 50 of opposing ones of the first plurality of FET devices 18, the second plurality of FET devices 28, and the third plurality of FET devices 46, respectively, are coupled together.

The addition of the third FET device stack 44 provides piecewise linearization compensation of the non-linear conduction characteristic of the first FET device stack 16. Moreover, additional FET stacks coupled in parallel with the third FET stack 44 may provide more degrees of freedom for piecewise linearization compensation of the non-linear conduction characteristic of the first FET device stack 16.

The second bias circuitry 38 provides a DC bias voltage to the third control terminals 52 of the third plurality of FET devices 46 through resistors R3 coupled between the second bias output terminal 40 and individual ones of the third control terminals 52. There is one each of the resistors R3 for each of the third control terminals 52. The resistors R3 typically have mega-ohm resistance values. The second gate control voltage $V_{GATE2}$ is also for turning the second plurality of FET devices 28 from the off-state to the on-state. As with the stacked FET switch 10, in some embodiments, the first bias circuitry 35 and/or the second bias circuitry 38 are configured to automatically adjust bias voltage to track with changes in process, supply voltage, and temperature for the stacked FET switch 42. While the third plurality of FET devices 46 is depicted as comprising N-channel ballistic FETs, the third plurality of FET devices 46 may also comprise P-channel ballistic FETs.

Figure 5:
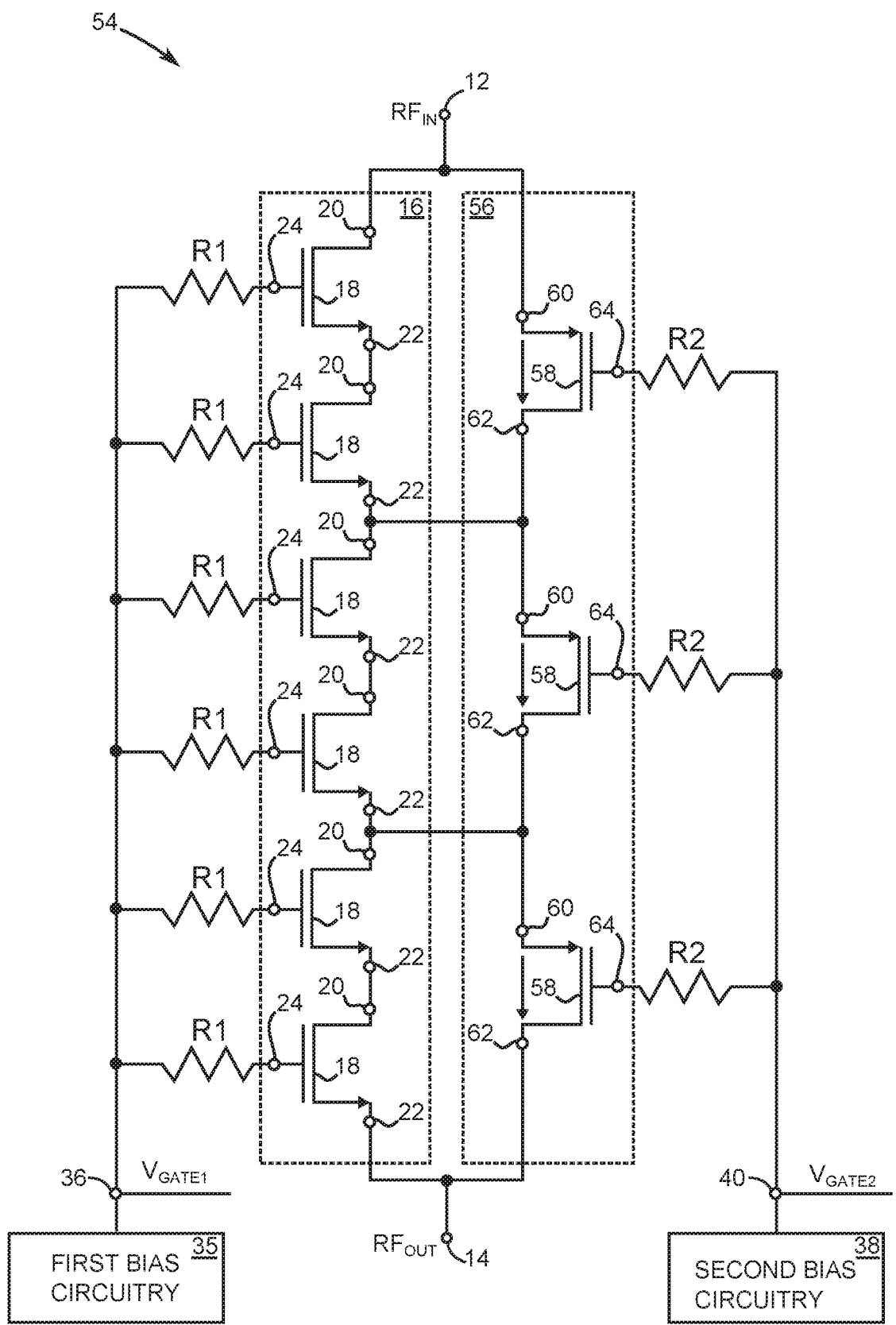
FIG. 5 is a schematic of an embodiment of a stacked FET switch that in accordance with the present disclosure includes a second FET device stack having fewer FET devices added to a structure in common with the stacked FET switch of FIGS. 1-3.

FIG. 5 is a schematic of an embodiment of a stacked FET switch 54 that in accordance with the present disclosure includes a second FET device stack 56 added to a structure in common with the stacked FET switch 10 of FIGS. 1-3. In this exemplary embodiment, the second FET device stack 56 has a second plurality of FET devices 58 that has half as many FETs as the first plurality of FET devices 18. The second plurality of FET devices 58 is coupled in series between the first port 12 and the second port 14. Each of the second plurality of FET devices 58 has a third current terminal 60, a fourth current terminal 62, and a second control terminal 64. In this exemplary embodiment, there is one of the second plurality of FET devices 58 coupled in parallel across for every two of the first plurality of FET devices 18. Specifically, the first current terminal 20 and third current terminal 60 of every other opposing ones of the first plurality of FET devices 18 and the second plurality of FET devices 58 are coupled together. Moreover, the second current terminal 22 and the fourth current terminal 62 of every other opposing ones of the first plurality of FET devices 18 and the second plurality of FET devices 58 are coupled together. A benefit of having fewer FET devices in the second FET device stack 56 is that a larger voltage across each of the second plurality of FET devices 58 results in a carrier mobility increase.

Figure 6:
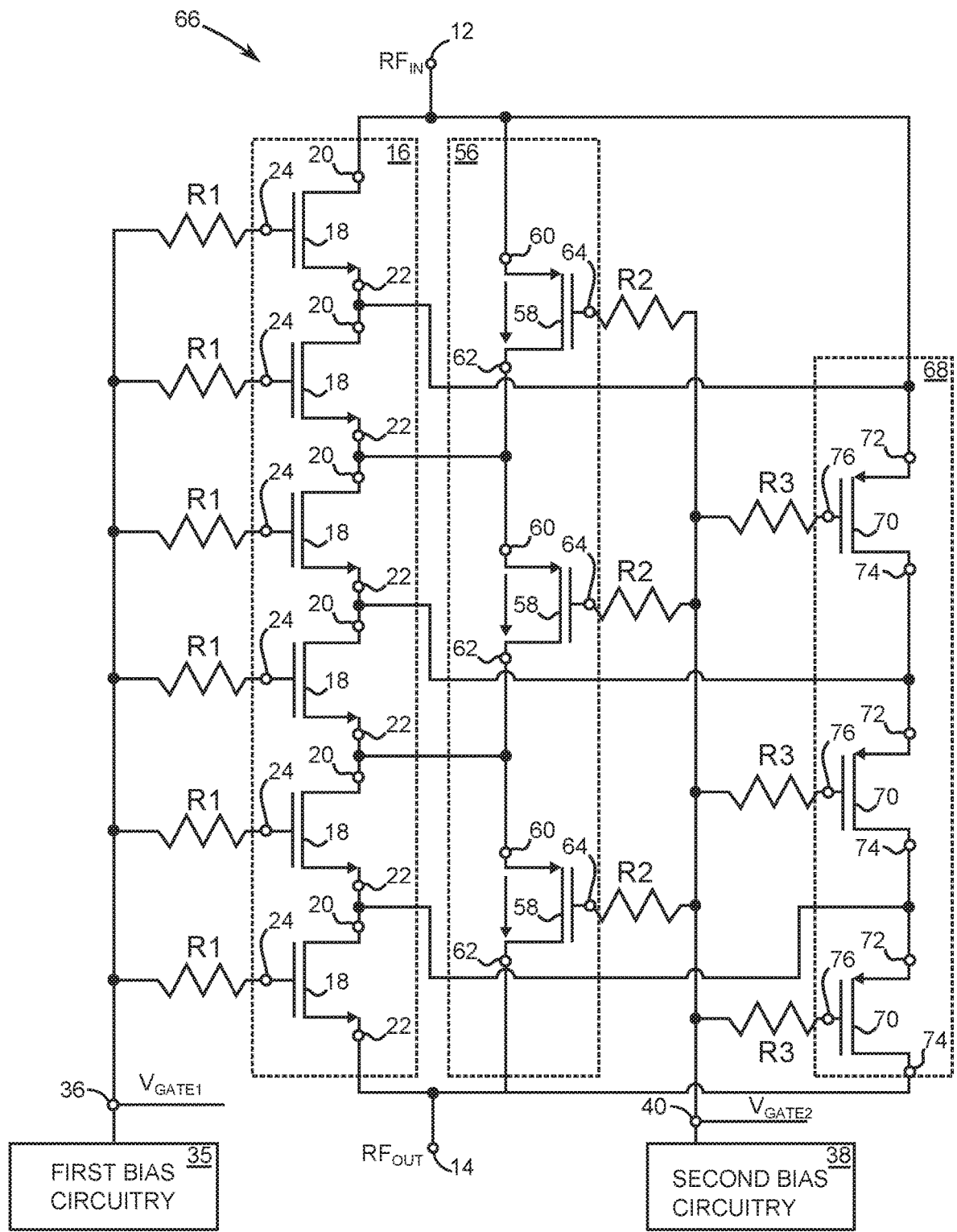
FIG. 6 is a schematic of an embodiment of a stacked FET switch that in accordance with the present disclosure includes a third FET device stack with a third plurality of FET devices having an equal number of FET devices as the second plurality of FET devices.

FIG. 6 is a schematic of an embodiment of a stacked FET switch 66 that in accordance with the present disclosure includes a third FET device stack 68 with a third plurality of FET devices 70 having an equal number of FET devices as the second plurality of FET devices 58. In this exemplary embodiment, there is one of the third plurality of FET devices coupled in parallel across for every two of the first plurality of FET devices 18 beginning with two of the first plurality of FET devices 18 closest to the second port 14. As alluded to in the description of the embodiment of FIG. 5, a benefit of having fewer FET devices in the third FET device stack 68 is that a larger voltage across each of the third plurality of FET devices 70 results in a carrier mobility increase. However, the stacked FET switch 66 has an additional benefit of increased current handling due to the addition of the third FET device stack 68.

Figure 7:
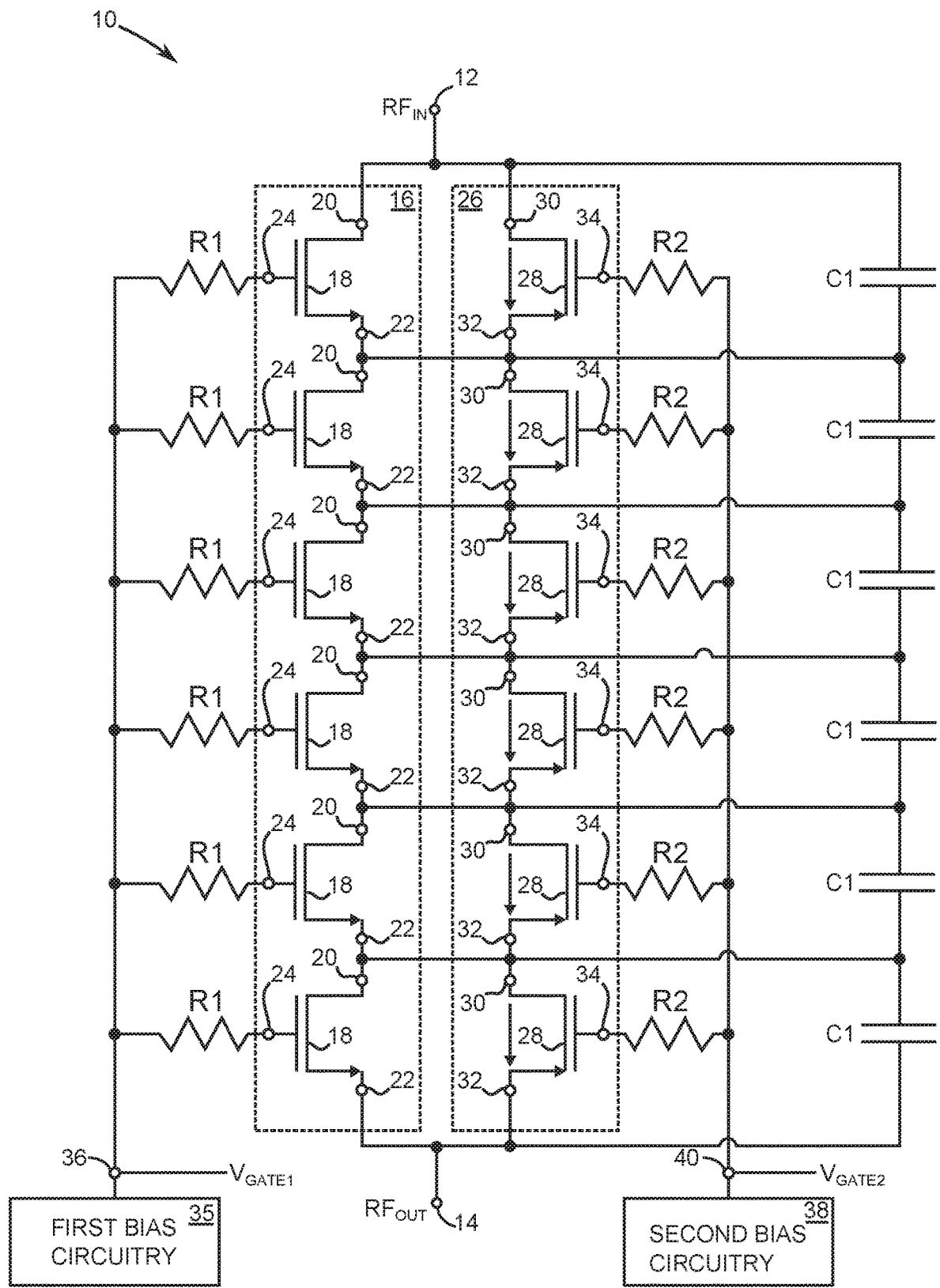
FIG. 7 is a schematic of an embodiment of the stacked FET switch of FIG. 1 that employs a plurality of capacitors wherein each of the plurality of capacitors is coupled in parallel with a corresponding one of the second plurality of FET devices.

FIG. 7 is a schematic of an embodiment of the stacked FET switch 10 of FIG. 1 that employs a plurality of capacitors C1 wherein each of the plurality of capacitors C1 is coupled in parallel with a corresponding one of the second plurality of FET devices 28. The plurality of capacitors C1 stabilize the parasitic capacitances of the first plurality of FET devices 18 and the second plurality of FET devices 28 such that a total capacitance value for the stacked FET switch 10 deviates by no more ±5% while the stacked FET switch 10 is in an open state. In at least one embodiment, each of the plurality of capacitors C1 is a metal-insulator-metal type capacitor or a metal-oxide-metal type capacitor.

Figure 8:
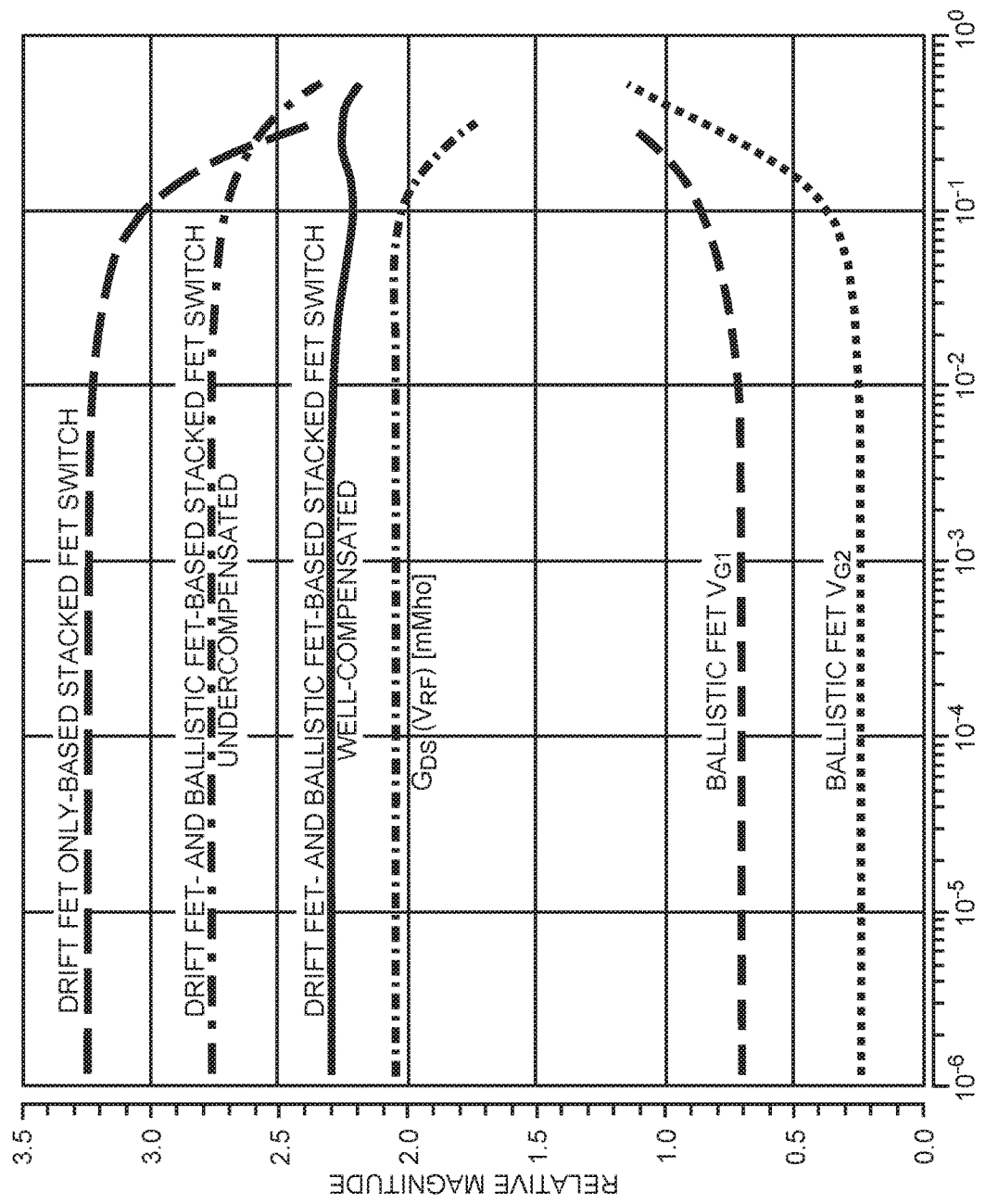
FIG. 8 is a graph of relative magnitude for on-state conductance for drift FETs, ballistic FETs, and stacked drift FETs coupled in parallel with ballistic FETs to illustrate linearization of the on-state conductance for the stacked FET switches of the present disclosure.

FIG. 8 is a graph of relative magnitude for on-state conductance for drift FETs, ballistic FETs, and stacked drift FETs coupled in parallel with ballistic FETs to illustrate linearization of the on-state conductance for the stacked FET switches of the present disclosure. The next-to-bottom curve depicted in medium dashed line depicts on-state conductance for a ballistic FET biased at a first bias voltage $V_{G1}$. The bottom curve depicted in short dashed line depicts on-state conductance for a ballistic FET biased at a second bias voltage $V_{G2}$. Notice that the on-state conductance increases as RF signal voltage $V_{RF}$ increases. This increase is opposed to the on-state conductance decrease with increasing RF signal voltage. Notice that the top curve depicted in long dashed line has decreasing conductance with increasing RF signal voltage. A curve second from the top depicted in thick dot-dash line represents an undercompensated result for a drift FET- and ballistic FET-based stacked FET switch. The compensation is improved by adjusting the bias voltage to the ballistic FETs making up the stacked FET switch. The solid curve depicts a well-compensated drift FET- and ballistic FET-based stacked FET switch such as that realized by any of the exemplary stacked FET switches of the present disclosure. The thinner dot-dashed line just below the solid curve depicts drain-to-source conductance $G_{DS}$ for a drift FET.

Figure 9:
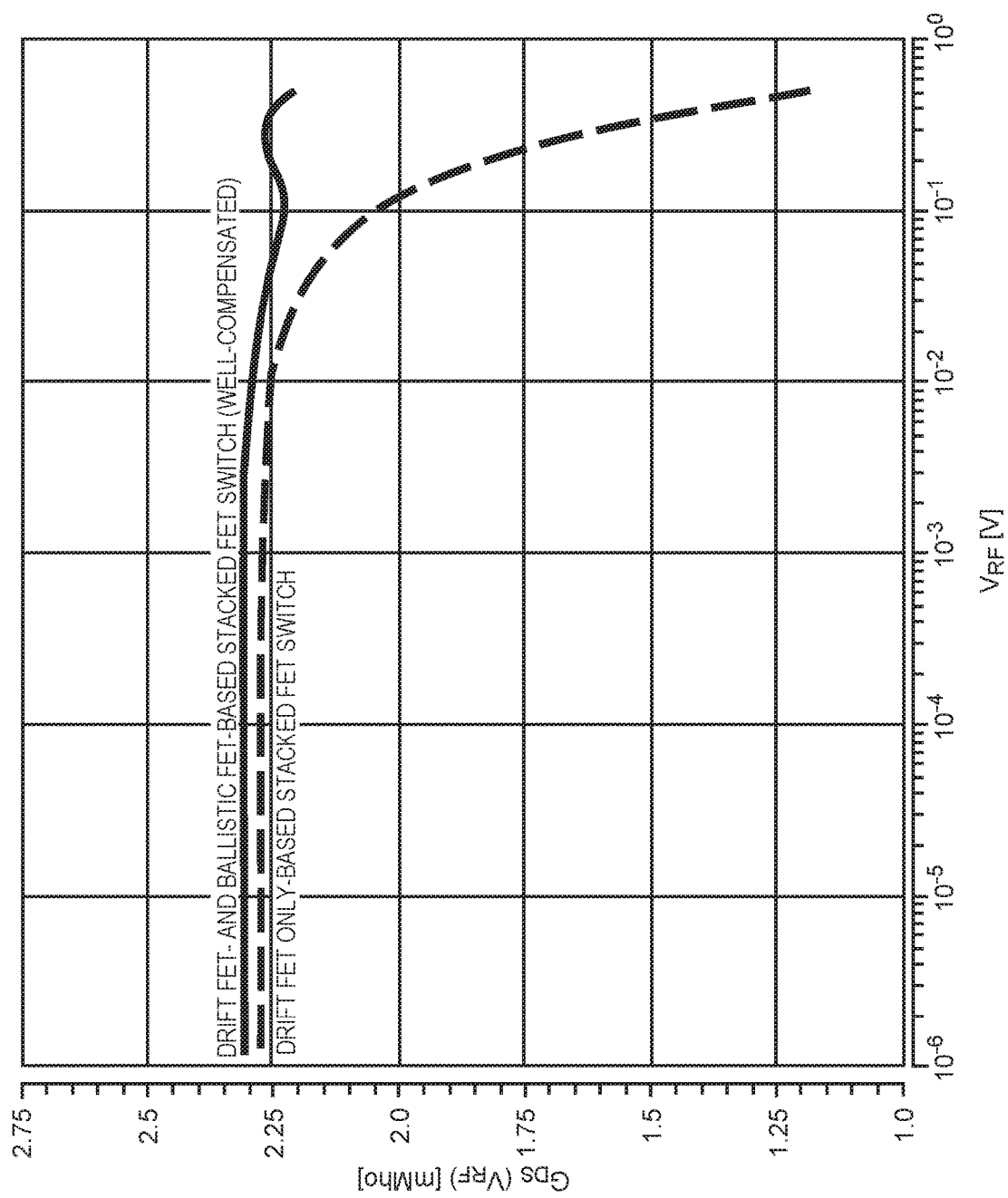
FIG. 9 is a graph depicting a well-compensated drift FET- and ballistic FET-based stacked FET switch such as realized by any of the exemplary stacked FET switches of the present disclosure in comparison to a traditional drift FET-based stacked FET switch.

FIG. 9 is a graph depicting a well-compensated drift FET- and ballistic FET-based stacked FET switch such as that realized by any of the exemplary stacked FET switches of the present disclosure in comparison to a traditional drift FET-based stacked FET switch. In this particular case, the well-compensated drift FET- and ballistic FET-based stacked FET switch is made up of N-channel FETs and P-channel FETs, and the traditional drift FET-based stacked FET switch is made up of only N-channel FETs.

Figure 10:
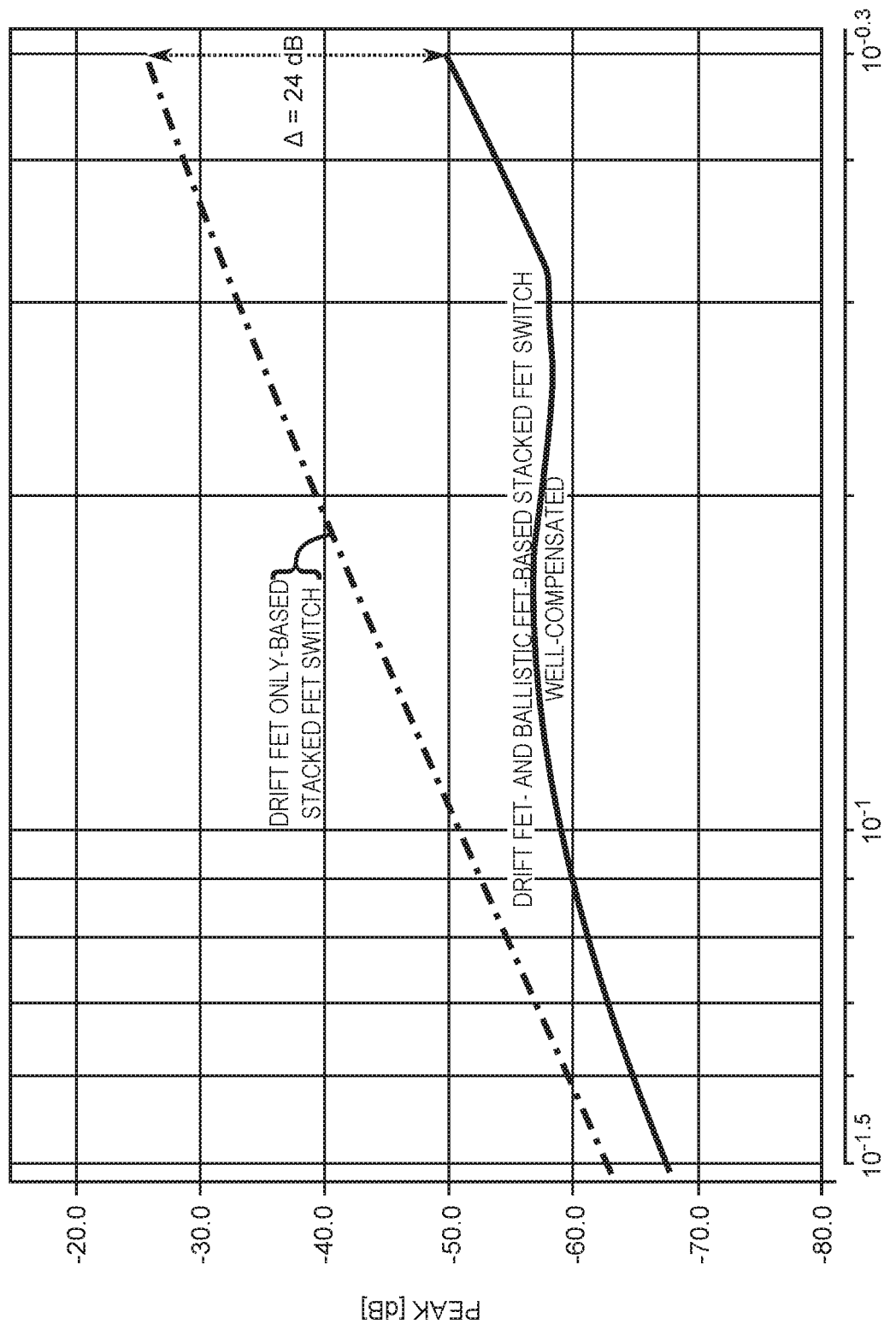
FIG. 10 is a plot of harmonic distortion versus signal voltage for a drift FET-only-based stacked FET switch and a well-compensated drift FET—and ballistic FET-based stacked FET switch such as the exemplary embodiment of the FET-based switch of FIG. 2.

FIG. 10 is a plot of harmonic distortion versus signal voltage for a drift FET-only-based stacked FET switch and a well-compensated drift FET- and ballistic FET-based stacked FET switch such as the exemplary embodiment of the stacked FET switch 10 of FIG. 2. In this case, linearization provided by the stacked FET switch 10 of FIG. 2 decreases harmonic distortion by 24 dB. Harmonic distortion can even be further reduced by substrate selection for the stacked FET switch 10.

Figure 11:
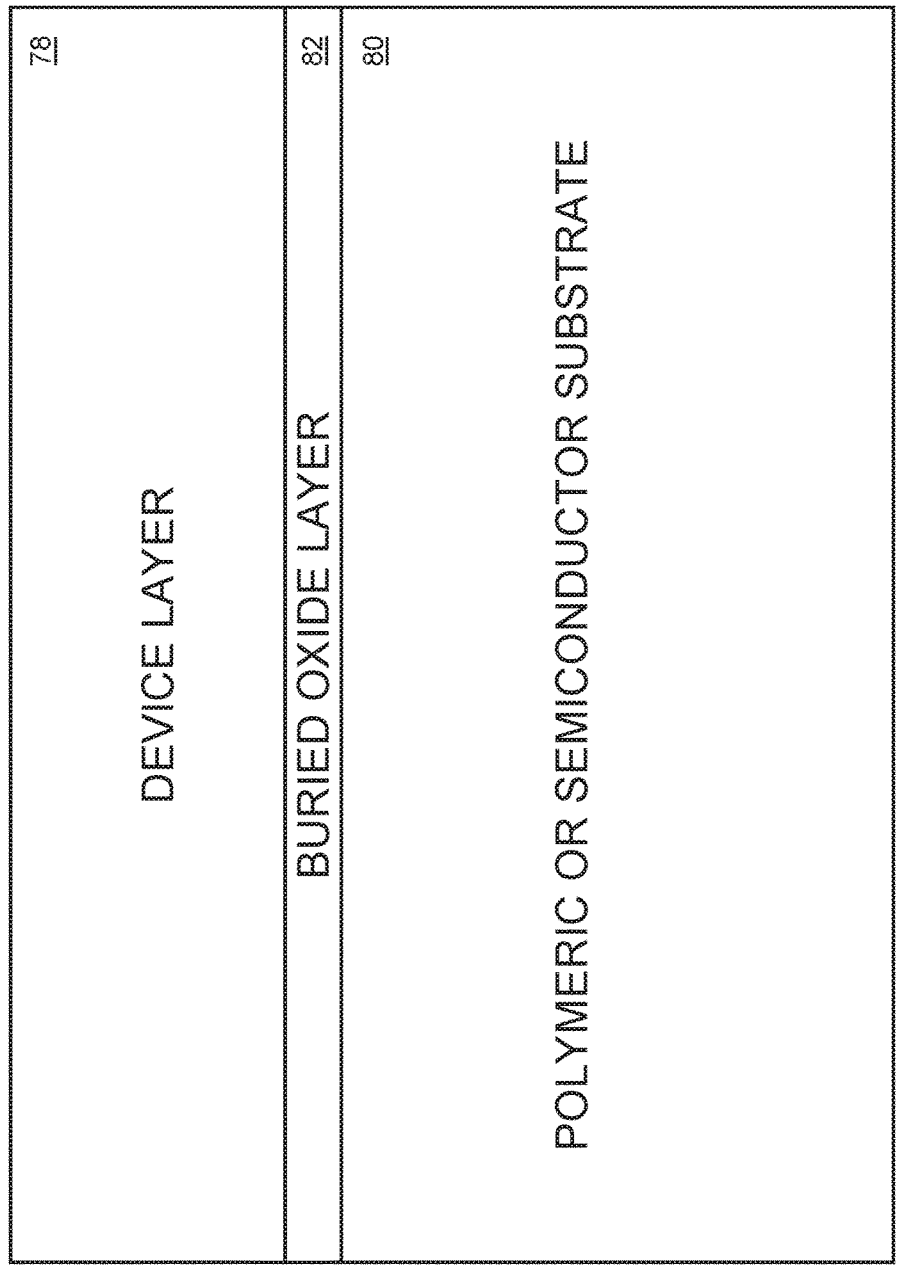
FIG. 11 is a cross-sectional view of the stacked FET switch 10 showing a device layer in which the first FET stack 16 (FIG. 1) is formed over a substrate.

In this regard, FIG. 11 is a cross-sectional view of the stacked FET switch 10 showing a device layer 78 in which the first FET device stack 16 (FIG. 1) and the second FET device stack 26 reside. A substrate 80 supports the device layer 78. A buried oxide layer 82 may be an etch stop layer that is interfaced directly with and between both the device layer 78 and the substrate 80. In some embodiments, the substrate 80 is made of a polymeric material such as thermoplastic or epoxy. However, it is to be understood that other embodiments of the present disclosure remain functional on typical high-resistance semiconductor substrates such as silicon. Thus, in at least some embodiments, the stacked FET switch 10 is of the silicon-on-insulator type in which high-resistance silicon substrates are employed. Nevertheless, there are benefits to replacing the typical high-resistance semiconductor substrates with a substrate made of polymeric material. For example, polymeric material has electrical properties that provide superior isolation during operation and prevent harmonics from being generated within the substrate 80. Moreover, additives such as nano-powders may be included in the polymeric material to increase thermal conductivity of the stacked FET switch 10.

Semiconductor substrates may be replaced with polymeric substrates using techniques disclosed in U.S. Patent Publication Nos. 20140252566 A1, 20140306324 A1, 20150255368 A1, now issued as U.S. Pat. No. 9,812,350, 20160079137 A1, now issued as U.S. Pat. No. 9,824,951, 20160100489 A1 now issued as U.S. Pat. No. 10,085,352, 20160126196 A1 now issued as U.S. Pat. No. 10,121,718, 20160343604 A1, 20160343592 A1 now issued as U.S. Pat. No. 9,860,145, 20170032957 A1 now issued as U.S. Pat. No. 10,062,637, 20170098587 A1 now issued as U.S. Pat. No. 10,199,301, 20170271200 A1 now issued as U.S. Pat. No. 10,134,627, and 20170309709 A1 now issued as U.S. Pat. No. 10,038,055; U.S. Pat. Nos. 9,214,337, 9,583,414, and 9,613,831; and U.S. patent application Ser. No. 15/353,346, filed Nov. 16, 2016, now issued as U.S. Pat. No. 10,103,080, titled THERMALLY ENHANCED SEMICONDUCTOR PACKAGE WITH THERMAL ADDITIVE AND PROCESS FOR MAKING THE SAME; U.S. patent application Ser. No. 15/491,064, filed Apr. 19, 2017, now issued as U.S. Pat. No. 10,068,831, titled THERMALLY ENHANCED SEMICONDUCTOR PACKAGE AND PROCESS FOR MAKING THE SAME; U.S. patent application Ser. No. 15/498,040, filed Apr. 26, 2017, now issued as U.S. Pat. No. 10,109,502titled SEMICONDUCTOR PACKAGE WITH REDUCED PARASITIC COUPLING EFFECTS AND PROCESS FOR MAKING THE SAME; U.S. patent application Ser. No. 15/601,858, filed May 22, 2017, titled WAFER-LEVEL PACKAGE WITH ENHANCED PERFORMANCE; U.S. patent application Ser. No. 15/695,579, filed Sep. 5, 2017, titled MICROELECTRONICS PACKAGE WITH SELF-ALIGNED STACKED-DIE ASSEMBLY; and U.S. patent application Ser. No. 15/695,629, filed Sep. 5, 2017, now issued as U.S. Pat. No. 10,366,972, titled MICROELECTRONICS PACKAGE WITH SELF-ALIGNED STACKED-DIE ASSEMBLY, which are hereby incorporated by reference in their entireties. Some of the disclosed substrate replacement techniques are applied at a die-level process, whereas others are applied during a wafer-level process.

Those skilled in the art will recognize improvements and modifications to the preferred embodiments of the present disclosure. All such improvements and modifications are considered within the scope of the concepts disclosed herein and the claims that follow.

What is claimed is:

1. A stacked field-effect transistor (FET) switch comprising:
a first FET device stack that is operable in an on-state and in an off-state, the first FET device stack comprising a first plurality of FET devices coupled in series between a first port and a second port and having a first on-state conductance that decreases with increasing voltage between the first port and the second port between 10% and 99% of a first breakdown voltage of the first FET device stack when the first FET device stack is in the on-state; and
a second FET device stack that is operable in the on-state and in the off-state, the second FET device stack comprising a second plurality of FET devices coupled in series between the first port and the second port, wherein the second FET device stack is configured to have a second on-state conductance that increases with increasing voltage between the first port and the second port between 10% and 99% of a second breakdown voltage of the second FET device stack to compensate for decreasing of the first on-state conductance when both the first FET device stack and the second FET device stack are in the on-state.

2. The stacked FET switch of claim 1 wherein the second plurality of FET devices comprises ballistic FET devices.

3. The stacked FET switch of claim 1 wherein the first plurality of FET devices comprises N-channel FET devices and the second plurality of FET devices comprises P-channel FET devices.

4. The stacked FET switch of claim 3 wherein the P-channel FET devices are germanium doped to enhance carrier mobility.

5. The stacked FET switch of claim 1 wherein the first plurality of FET devices comprises N-channel FET devices and the second plurality of FET devices comprises N-channel FET devices.

6. The stacked FET switch of claim 1 wherein each of the first plurality of FET devices is coupled in parallel with a corresponding one of the second plurality of FET devices.

7. The stacked FET switch of claim 1 further comprising a plurality of capacitors wherein each of the plurality of capacitors is coupled in parallel with a corresponding one of the second plurality of FET devices such that parasitic capacitances of the first plurality of FET devices and the second plurality of FET devices cause a total capacitance of the stacked FET switch to deviate by no more ±5% while the stacked FET switch is in an open state.

8. The stacked FET switch of claim 7 wherein the plurality of capacitors comprises metal-insulator-metal type capacitors.

9. The stacked FET switch of claim 1 further comprising a first bias circuitry having a first output coupled to first control terminals of the first plurality of FET devices and a second bias circuitry having a second bias output coupled to second control terminals of the second plurality of FET devices.

10. The stacked FET switch of claim 9 wherein the first bias circuitry and the second bias circuitry are each configured to automatically adjust bias voltage level to track with changes in supply voltage.

11. The stacked FET switch of claim 9 wherein the first bias circuitry and the second bias circuitry are each configured to automatically adjust bias voltage level to track with changes in temperature.

12. The stacked FET switch of claim 9 wherein the first bias circuitry and the second bias circuitry are each configured to automatically adjust bias voltage level to track with changes in supply voltage and changes in temperature.

13. The stacked FET switch of claim 9 wherein the first bias circuitry is configured to generate a first bias voltage level that is different from a second bias voltage level generated by the second bias circuitry.

14. The stacked FET switch of claim 1 wherein the second plurality of FET devices comprises fewer FET devices than the first plurality of FET devices.

15. The stacked FET switch of claim 14 wherein there is one FET device of the second plurality of FET devices coupled in parallel across for every two FET devices of the first plurality of FET devices beginning with two FET devices of the first plurality of FET devices closest to the first port.

16. The stacked FET switch of claim 15 further including a third plurality of FET devices having an equal number of FET devices as the second plurality of FET devices, wherein there is one FET device of the third plurality of FET devices coupled in parallel across for every two FET devices of the first plurality of FET devices beginning with two FET devices of the first plurality of FET devices closest to the second port.

17. The stacked FET switch of claim 1 wherein the first plurality of FET devices and the second plurality of FET devices are of the silicon-on-insulator type.

18. The stacked FET switch of claim 1 further comprising:
a polymeric substrate; and
a device layer within which the first FET device stack and the second FET stack reside, wherein the device layer is directly supported by the polymeric substrate.

19. The stacked FET switch of claim 1, wherein at least 50% carrier transport of the first plurality of FET devices is drift transport and at least 70% of carrier transport of the second plurality of FET devices is ballistic transport.

20. The stacked FET switch of claim 1 wherein the physical size of the second plurality of FET devices is different from the physical size of the first plurality of FET devices.

21. The stacked FET switch of claim 1 wherein each of the first plurality of FET devices has a first number of gate fingers and each of the second plurality of FET devices has a second number of gate fingers that is different in number from the first number of gate fingers.

* * * * *